United States Patent
Kim (10) Patent No.: US 7,250,331 B2
(45) Date of Patent: Jul. 31, 2007

(54) MASK FOR CRYSTALLIZING AND METHOD OF CRYSTALLIZING AMORPHOUS SILICON USING THE SAME

(75) Inventor: Sang-Hyun Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/004,102

(22) Filed: Dec. 6, 2004

(65) Prior Publication Data
US 2005/0095762 A1 May 5, 2005

Related U.S. Application Data (62) Division of application No. 10/419,841, filed on Apr. 22, 2003, now Pat. No. 6,875,547.

(30) Foreign Application Priority Data
May 23, 2002 (KR) ................ 2002-28603

(51) Int. Cl.
H01L 21/84 (2006.01)
H01L 21/00 (2006.01)
H01L 21/425 (2006.01)
(52) U.S. Cl. ................ 438/166; 438/531; 257/E21.134
(58) Field of Classification Search ................ 438/531, 438/592, 942, 943, 944, 945, 946, 166
See application file for complete search history.

(56) References Cited

U.S. PATENT DOCUMENTS

| 6,117,752 A * | 9/2000 | Suzuki ........................ 438/487 |
| 6,767,804 B2 * | 7/2004 | Crowder ..................... 438/487 |
| 2003/0199176 A1 * | 10/2003 | Adachi et al. .............. 438/795 |

FOREIGN PATENT DOCUMENTS

KR 2000-0001170 1/2000

* cited by examiner

Primary Examiner—Alexander Ghyka
(74) Attorney, Agent, or Firm—McKenna Long & Aldridge LLP (57) ABSTRACT

A method of crystallizing amorphous silicon using a mask having a transmitting portion including a plurality of stripes, wherein end lines of at least two stripes are not collinear; and a blocking portion enclosing the plurality of stripes includes the steps of setting the mask over a substrate having an amorphous silicon layer, applying a first laser beam to a first area of the amorphous silicon layer through the mask, thereby forming a first crystallization region, moving the substrate in a first direction, thereby disposing the blocking portion of the mask over the first crystallization region, and applying a second laser beam to the first area of the amorphous silicon layer through the mask, thereby forming a second crystallization region.

7 Claims, 7 Drawing Sheets

MASK FOR CRYSTALLIZING AND METHOD OF CRYSTALLIZING AMORPHOUS SILICON USING THE SAME

This application is a divisional of prior application Ser. No. 10/419,841, filed Apr. 22, 2003 now U.S. Pat. No. 6,875,547.

This application claims the benefit of Korean Patent Application No. 2002-28603, filed in Korea on May 23, 2002, which is hereby incorporated by reference for all purposes as if fully set forth herein.

BACKGROUND OF THE INVENTION

1. Field of the Invention

The present invention relates to a method of crystallizing amorphous silicon. More particularly, the present invention relates to a mask for crystallizing the amorphous silicon and a sequential lateral solidification (SLS) crystallizing method using the same.

2. Discussion of the Related Art

In general, silicon is categorized into amorphous silicon and crystalline silicon depending on the crystalline state.

Amorphous silicon is widely used as an active layer of a thin film transistor (TFT) of a liquid crystal display device, because amorphous silicon can be formed on a large, low cost substrate such as glass under relatively low temperatures. However, amorphous silicon has a field effect mobility of about 1 $cm^2/V \cdot s$, which limits the size of display devices using amorphous silicon. Besides, the use of amorphous silicon may decrease the electrical performance and reliability of the display devices.

Because of the amorphous silicon limitations, research and development into polycrystalline silicon is ongoing. The field effect mobility of polycrystalline silicon is more than about 100 $cm^2/V \cdot s$ and is 100 to 200 times greater than that of amorphous silicon. Additionally, polycrystalline silicon is optically and thermally stable. Therefore, polycrystalline silicon may be used in large and high-definition display devices such as liquid crystal display devices for laptop computer monitors or flat panel televisions. Polycrystalline silicon is also suited for use in driver integrated circuits (ICs) for driving the display devices, and thus has the advantage that the number of fabrication steps may be reduced because thin film transistors and driver ICs may be formed on the same substrate, eliminating the need for tape automated bonding (TAB) techniques.

The electrical properties of polycrystalline silicon depend on the grain size, i.e., the field effect mobility increases in proportion to the grain size. Accordingly, the formation of single crystalline silicon is important, and recently, a sequential lateral solidification (SLS) method has become of interest. The SLS method takes advantage of the fact that silicon grains grow laterally from the boundary between liquid silicon and solid phase silicon. The SLS method can increase the size of the silicon grains that are growing by controlling the energy intensity of a laser beam and the irradiation range of the laser beam, as disclosed in PCT international application publication number WO 97/45827 and Korean patent publication number 2001-004129, which are incorporated herein by reference for all purposes as if fully set forth herein. The SLS method enables TFTs to have channel areas of single crystalline silicon.

A conventional SLS method will be described in detail with reference to the attached drawings.

Figure 1:
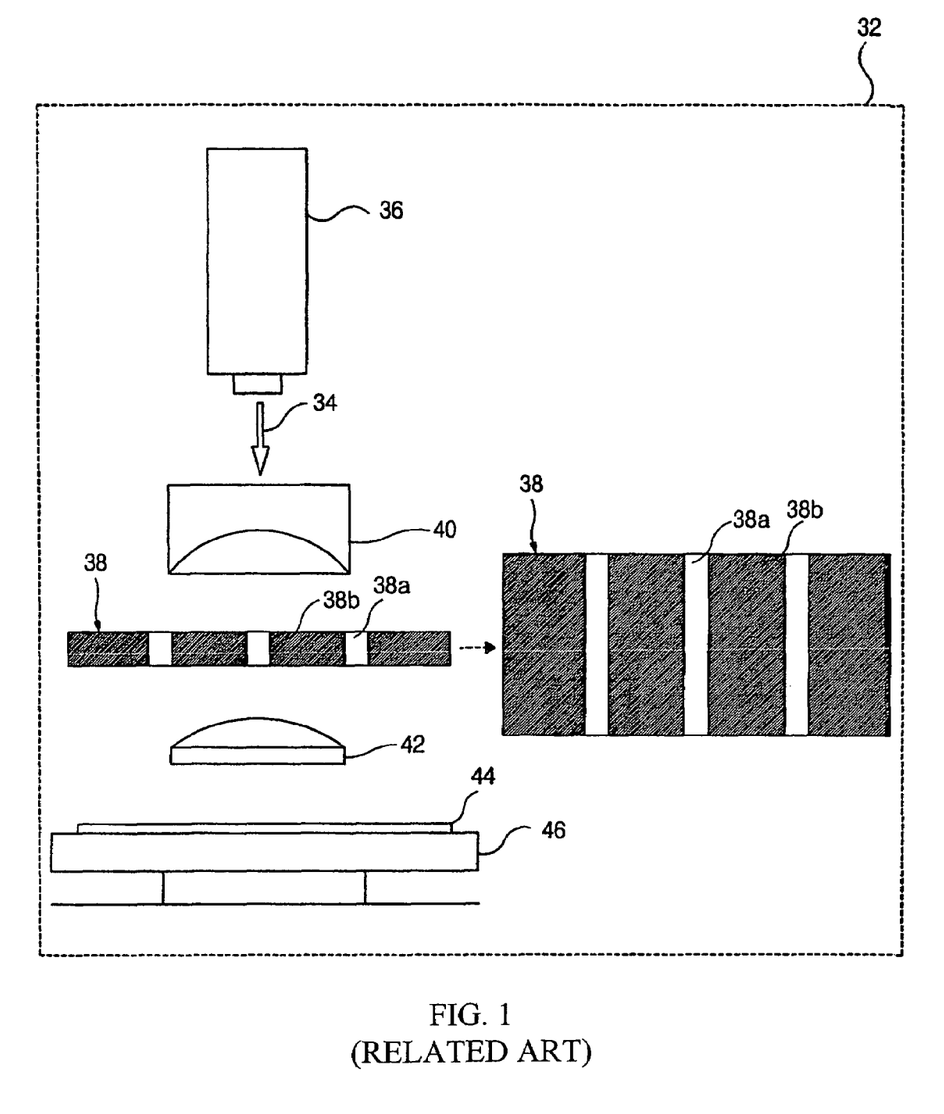
FIG. 1 is a schematic configuration of a related art sequential lateral solidification (SLS) apparatus.

FIG. 1 illustrates a conventional SLS apparatus. In FIG. 1, the conventional SLS apparatus 32 includes a laser source 36 generating a laser beam 34, a condenser lens 40 condensing the laser beam 34, a mask 38 partially transmitting the laser beam 34, an imaging lens 42 shrinking the laser beam at a fixed rate, and a X-Y stage 46 moving in X and Y directions, which are perpendicular to each other. A substrate 44 is situated on the X-Y stage 46, and an amorphous silicon layer is formed on the substrate 44.

A laser beam 34 emitted from the laser source 36 is regulated through an attenuator (not shown), which may be disposed between the laser source 36 and the condenser lens 40, and is irradiated on the substrate 44 through the condenser lens 40, the mask 38 and the imaging lens 42. Thus, the amorphous silicon layer exposed to the laser beams 34 is melted and crystallized. The mask 38 has a transmitting region 38a and a blocking region 38b.

In order to crystallize the whole amorphous silicon layer, the X-Y stage 46 is moved slightly, and the next area of the amorphous silicon layer is exposed to the laser beams 34. Therefore, the next area of the amorphous silicon layer is crystallized.

The amorphous silicon layer may be deposited on a substrate by a chemical vapor deposition method and may include a lot of hydrogen therein. The hydrogen in the amorphous silicon layer breaks away from the amorphous silicon layer under temperatures over 350° C. and has an effect on the surface roughness of the amorphous silicon layer. Thus, the amorphous silicon layer, generally, may be dehydrogenated through a heat treatment process before crystallizing the amorphous silicon layer.

A buffer layer may be formed between the amorphous silicon layer and the substrate. The buffer layer prevents impurities in the substrate from entering into the amorphous silicon layer.

Figure 2:
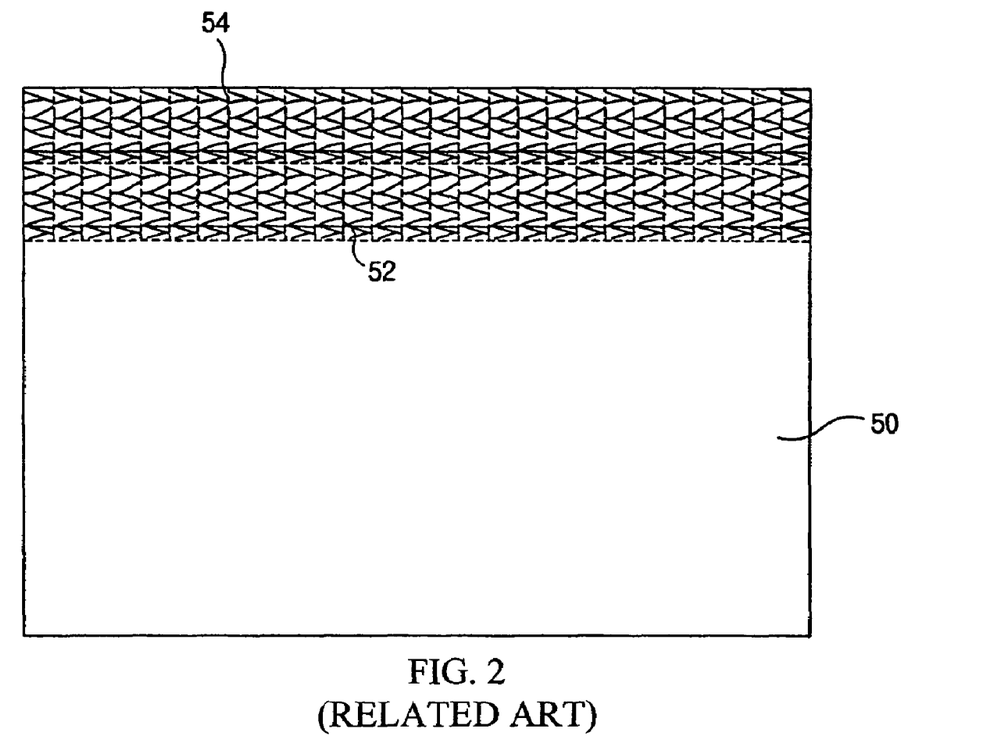
FIG. 2 is a plan view showing an amorphous silicon layer crystallized in part by using the SLS method according to the related art.

FIG. 2 is a plan view showing an amorphous silicon layer crystallized in part by using the SLS method according to the related art. The amorphous silicon layer 50 is dehydrogenated, and then is partially crystallized by the SLS method according to the related art. Grain boundaries 52 and 54 are formed in the crystallized area. As shown in FIG. 2, only a part of the amorphous silicon layer 50 is crystallized due to the size of the mask 38 of FIG. 1. Therefore, the complete amorphous silicon layer 50 may be crystallized by repeatedly displacing the mask and applying the laser beam.

Figure 3:
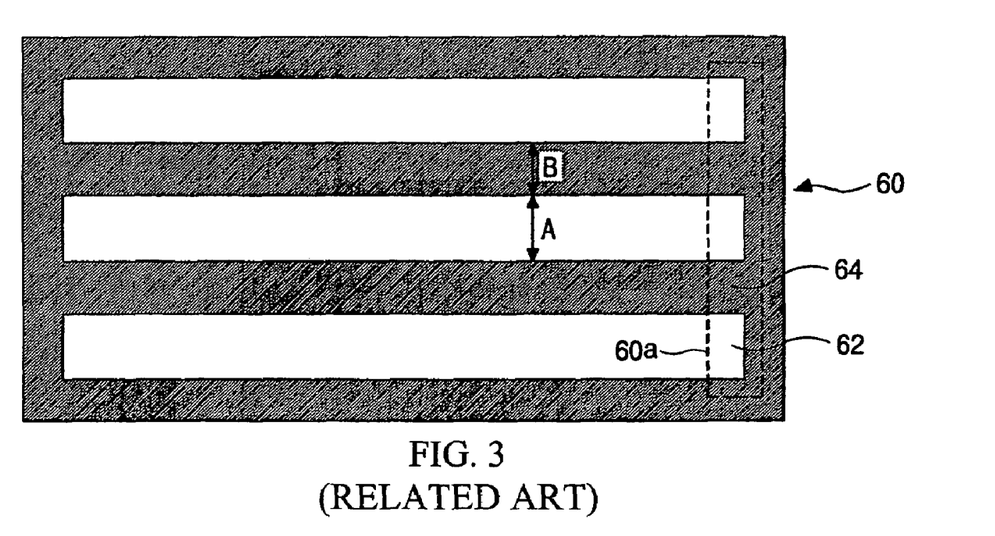
FIG. 3 is a schematic plan view showing a mask for crystallizing the amorphous silicon layer.

FIG. 3 is a schematic plan view showing a mask for crystallizing the amorphous silicon layer. The mask 60 includes a transmitting portion 62 and a blocking portion 64. The transmitting portion 62 is composed of a plurality of stripes, which are extended horizontally in the context of FIG. 3 and the ends of each stripe are collinear 60a. A transmitting portion width A, which corresponds to a width of an irradiated laser beam, is less than twice of a maximum growth length of a silicon grain when the laser beam is irradiated once, and a blocking portion width B is less than the transmitting width A.

When a first laser beam irradiates an amorphous silicon layer using the mask 60 of FIG. 3, the first laser beam melts the exposed amorphous silicon layer. Then, grains grow laterally from the boundaries of the melted amorphous silicon, and the growth of the grains stop at a region where the grains meet each other.

After the first crystallization, the mask 60 moves in an X-direction parallel to the horizontal length of the mask 60 in the context of FIG. 3, and the next irradiation and crystallization of the amorphous silicon layer is carried out. Here, the mask 60 has a horizontal length longer than a vertical width and shifts by several hundred micrometers to several millimeters, which corresponds to the horizontal length of the laser beam shrunk by the imaging lens 42 of FIG. 1. Therefore, the crystallizing time is reduced due to the large horizontal length of the mask 60. Alternatively, the substrate, including the amorphous silicon layer thereon, may be moved instead of the mask 60 by moving the X-Y stage 46 of FIG. 1.

Next, the amorphous silicon layer may be crystallized in a vertical direction in the context of FIG. 3 by moving the mask 60 or the X-Y stage of FIG. 1 in a Y-direction perpendicular to the X-direction and irradiating laser beam.

As stated above, if the beam width corresponding to the transmitting portion width is less than twice of the maximum growth length of the silicon grain, fine grains are not found in the crystallized silicon layer.

Figure 4A:
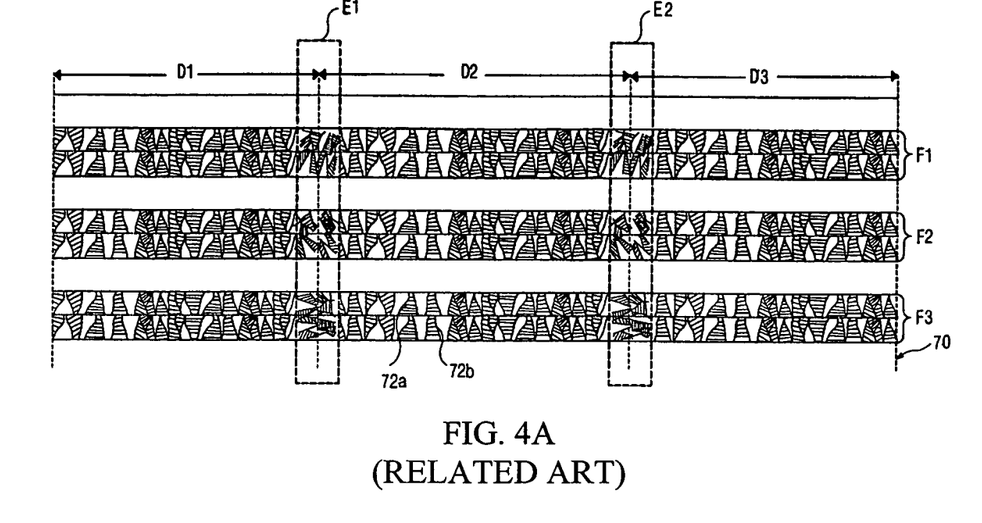
FIGS. 4A to 4C are views showing a process of crystallizing an amorphous silicon layer using the mask of FIG. 3.
Figure 4B:
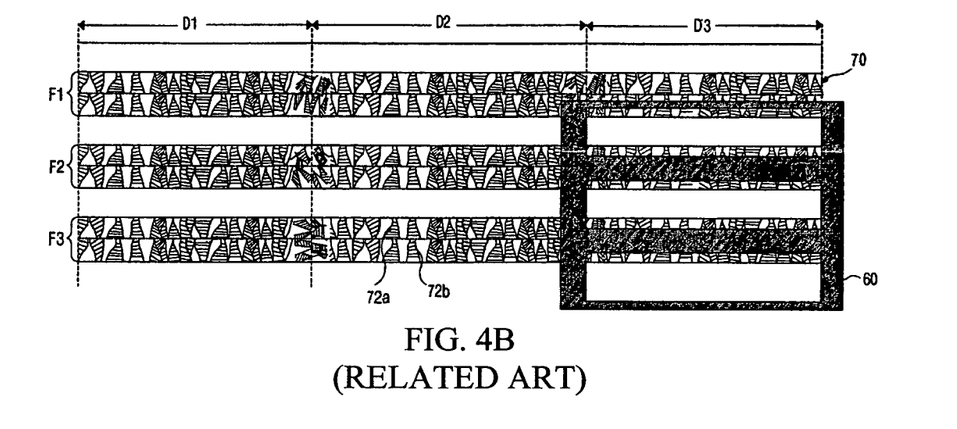
Figure 4C:
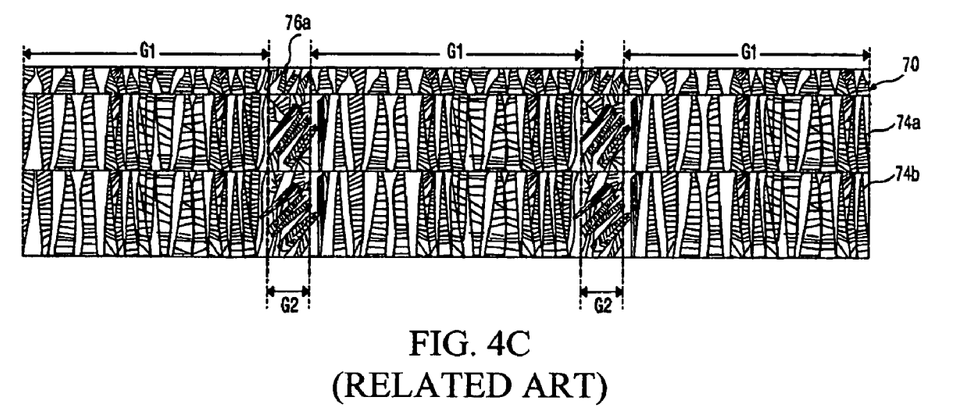

FIGS. 4A to 4C illustrate a process of crystallizing an amorphous silicon layer using the mask of FIG. 3.

In FIG. 4A, the mask 60 of FIG. 3 is disposed over a substrate 70 including an amorphous silicon layer thereon, and first, second and third laser beams irradiate first, second and third areas D1, D2 and D3, respectively, by moving the substrate 70 in a horizontal direction in the context of FIG. 4A. The substrate 70 is moved by the X-Y stage 46 of FIG. 1 and is shifted by several millimeters. Then, three crystallization regions F1, F2 and F3, which correspond to the transmitting portion 62 of the mask 60, are formed.

First grains 72a and 72b grow from the boundaries of the irradiated regions F1, F2 and F3 using the amorphous silicon as seeds. Growth of the first grains 72a and 72b stops when the first grains 72a and 72b meet each other. Therefore, the first to third crystallization regions F1, F2 and F3 are formed. The transmitting portion 62 of the mask 60 of FIG. 3 may include more than three stripes.

Since horizontal movements of the substrate 70 are limited to a distance such that the edges of the mask 60 overlap each other in the areas D1, D2 and D3, the second laser beam irradiated on the second area D2 is also applied on a part of the first area D1. Thus, there are non-uniform grains in the overlapping areas E1 and E2, which are formed between areas D1 and D2 and between areas D2 and D3, which are caused by interference and scattering of the laser beams. In the case where the transmitting portion 62 of the mask 60 has square edges, the laser beams melt the amorphous silicon layer in a circular shape due to the interference and the scattering. Therefore, grains grow discontinuously from the circular boundary as compared with the middle of the areas D1, D2 and D3.

Next, as shown in FIG. 4B, the substrate 70 is moved in a vertical direction in the context of FIG. 4B by the X-Y stage 46 of FIG. 1, and laser beams are irradiated on the first to third areas D1, D2 and D3. Also, the mask 60 may move in a direction opposite to the vertical direction that the substrate moves. Here, the transmitting portion 62 of the mask 60 corresponds to the amorphous silicon between the crystallization regions F1, F2 and F3, and the blocking portion 64 of the mask 60 corresponds to the crystallization regions F1, F2 and F3.

Accordingly, as shown in FIG. 4C, the amorphous silicon is crystallized over all. The second grains of 74a and 74b grow by using the first grains of 72a and 72b of the crystallization regions F1, F2 and F3 of FIG. 4B as seeds, and the second grains of 74a and 74b are larger than the first grains of 72a and 72b.

The SLS method can reduce the crystallizing time, and thus productivity of the polycrystalline silicon is improved.

However, the polycrystalline silicon layer has first portions G1 and second portions G2. The second portions G2 are disposed between the first portions G1 and have non-uniform grains 76a. The second portions G2 correspond to the edge of the mask. The second portions G2 are formed in a straight line.

Figure 5:
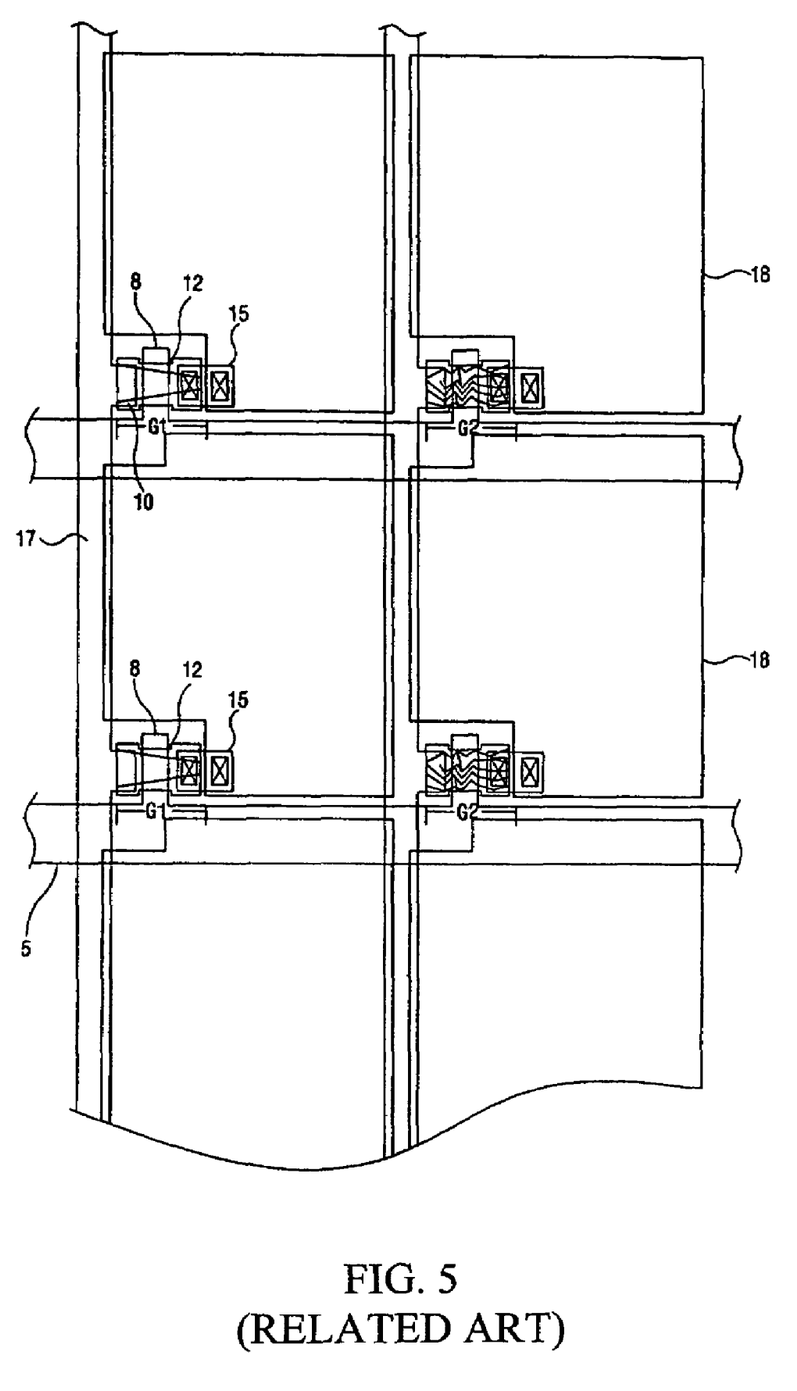
FIG. 5 is a plan view showing an array substrate including thin film transistors having a polycrystalline silicon layer formed by the SLS method of the related art as an active layer.

FIG. 5 shows an array substrate including thin film transistors having a polycrystalline silicon layer formed by the SLS method of the related art as an active layer. In FIG. 5, a gate line 5 and a data line 17 cross each other to define a pixel area, and at a crossing of the gate and data lines 5 and 17, a thin film transistor T is formed. A pixel electrode 18 is formed in the pixel area and is connected to the thin film transistor T. The thin film transistor T is composed of a gate electrode 8, a source electrode 10, a drain electrode 15, and an active layer 12. The active layer 12 is made of polycrystalline silicon, which may be formed by the above SLS method using the mask 60 of FIG. 3. The first portion G1 or the second portion G2 of FIG. 4C may be used as the active layer 12. The active layer 12 of the second portion G2 has lower field effect mobility than the active layer 12 of the first portion G1.

Therefore, in the case where the second portion G2 is used as the active layer 12 and because the second portion G2 is formed in a straight line, a line defect may occur in the display device and quality of display image is decreased.

SUMMARY OF THE INVENTION

Accordingly, the present invention is directed to a mask for crystallizing amorphous silicon and a crystallizing method using the mask that substantially obviates one or more of these problems due to limitations and disadvantages of the related art.

An advantage of the present invention is that it provides for polycrystalline silicon having large grains.

Another advantage of the present invention is that it provides for a method of crystallizing amorphous silicon with more uniform-sized grains.

Additional features and advantages of the invention will be set forth in the description that follows and, in part, will be apparent from the description or may be learned by practice of the invention. The objectives and other advantages of the invention will be realized and attained by the structure particularly pointed out in the written description and in the claims and appended drawings.

To achieve these and other advantages, and in accordance with the purpose of the present invention as embodied and broadly described, a method of crystallizing amorphous silicon using a mask having a transmitting portion including a plurality of stripes, wherein end lines of at least two stripes are not collinear; and having a blocking portion enclosing the plurality of stripes includes placing the mask over a substrate having an amorphous silicon layer, applying a first laser beam to a first area of the amorphous silicon layer through the mask, thereby forming a first crystallization region, moving the substrate in a first direction, thereby disposing the blocking portion of the mask over the first crystallization region and applying a second laser beam to the first area of the amorphous silicon layer through the mask, thereby forming a second crystallization region.

In another aspect of the present invention, a mask for crystallizing amorphous silicon includes: a transmitting portion including a plurality of stripes, wherein end lines of at least two stripes are not collinear and a blocking portion enclosing the plurality of stripes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, which is illustrated in the accompanying drawings.

Figure 6:
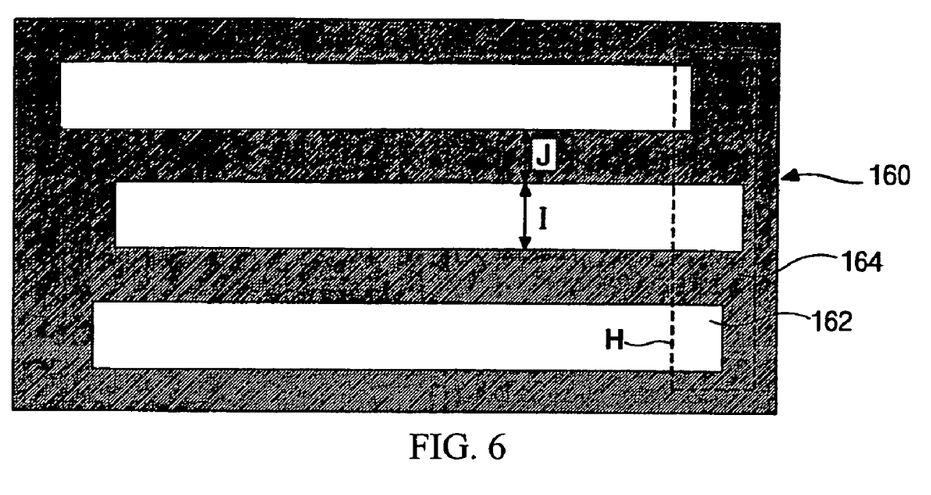
FIG. 6 is a schematic plan view showing a mask for crystallizing amorphous silicon according to an embodiment of the present invention.

FIG. 6 is a schematic plan view of a mask for crystallizing amorphous silicon according to an embodiment of the present invention. The mask 160 is composed of a transmitting portion 162 and a blocking portion 164. The transmitting portion 162 includes a plurality of stripes, which have the same length. The ends H of the stripes are not collinear. That is, ends of at least two of the stripes are offset from one another. The width I of each stripe is the same as or less than twice of the maximum growth length of silicon grains in order to get maximum lateral length of the grains using two laser beam exposures. The transmitting portion 162 of the mask 160 may include more than three stripes. The mask 160 may include quartz, and the blocking portion 164 may include chromium (Cr).

The mask 160 is disposed over a substrate including an amorphous silicon layer thereon, and a first laser beam irradiates the amorphous silicon layer through the mask. The amorphous silicon layer corresponding to the transmitting portion 162 of the mask 160 is melted and is crystallized from the boundaries of the melted region. Growth of silicon grains stops at a region where the grains meet each other. The mask 160 or a X-Y stage moves horizontally in the context of FIG. 6 and a second laser beam irradiates the amorphous silicon layer.

Figure 7A:
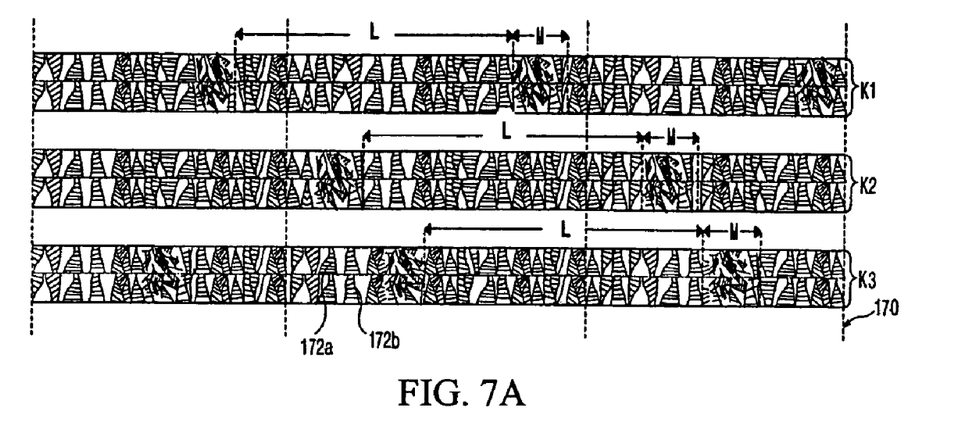
FIGS. 7A to 7C are views illustrating a process of crystallizing an amorphous silicon layer according to the present invention.
Figure 7B:
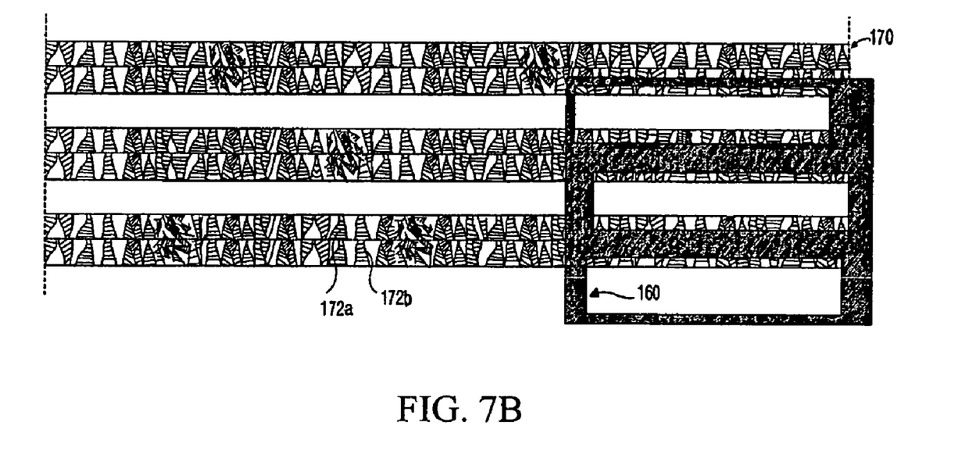
Figure 7C:
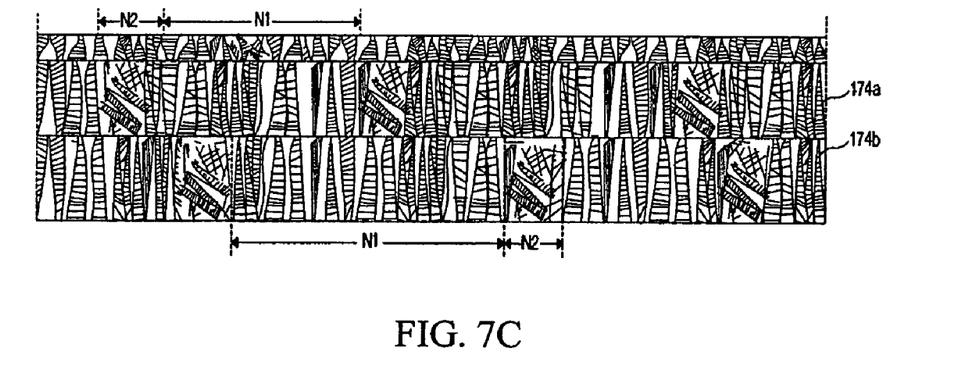

FIGS. 7A to 7C illustrate a process of crystallizing an amorphous silicon layer according to the present invention.

In FIG. 7A, the mask 160 of FIG. 6 may be disposed over a substrate 170 including an amorphous silicon layer thereon, and three crystallization regions K1, K2 and K3, which correspond to the transmitting portion 162 of the mask 160, are formed by repeatedly irradiating a laser beam and moving the substrate 170 or the mask 160 in a horizontal direction by a transmitting portion length L and M.

Here, in the crystallization regions K1, K2 and K3 irradiated by first to third laser beams, first grains 172a and 172b grow from the boundaries of the regions using the amorphous silicon as seeds. Growth of the first grains 172a and 172b stops when the first grains 172a and 172b meet each other. Therefore, the crystallization regions K1, K2 and K3 are formed.

In the present invention, because the end lines of the stripes of the transmitting portion 162 of FIG. 6 are not collinear, non-uniform grains are scattered in the crystallization regions K1, K2 and K3 relative to one another.

Next, as illustrated in FIG. 7B, the substrate 170 is moved in a vertical direction in the context of FIG. 7B, and laser beams irradiate regions between the crystallization regions K1, K2 and K3 while moving the substrate 170 in the horizontal direction. Also, the mask 160 may move instead of the substrate 170. Here, the transmitting portion 162 of the mask 160 corresponds to the amorphous silicon between the crystallization regions K1, K2 and K3, and the blocking portion 164 of the mask 160 corresponds to the crystallization regions K1, K2 and K3.

Accordingly, as illustrated in FIG. 7C, the amorphous silicon layer is crystallized over all. The second grains of 174a and 174b grow by using the first grains of 172a and 172b of the crystallization regions K1, K2 and K3 of FIG. 7B as seeds, and the second grains 174a and 174b are larger than the first grains 172a and 172b.

The polycrystalline silicon layer has first portions N1 and second portions N2, which have non-uniform grains. As stated above, because the end lines of the stripes of the transmitting portion 162 of FIG. 6 are not collinear, the second portions N2 are scattered in the polycrystalline silicon layer. Therefore, line defects are not shown in displayed images, and the quality of the displayed images is improved.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of crystallizing amorphous silicon using a mask having a transmitting portion including first and second stripes parallel with each other, wherein end lines of the first and second stripes are not collinear and having a blocking portion enclosing the first and second stripes, the method comprising:

placing the mask over a substrate having an amorphous silicon layer;

applying a first laser beam to a first area of the amorphous silicon layer through the mask, thereby forming a first crystallization region;

moving the substrate in a first direction, thereby disposing the blocking portion of the mask over the first crystallization region and overlapping ends of the first and second stripes with ends of the first crystallization region; and applying a second laser beam to the first area of the amorphous silicon layer through the mask, thereby forming a second crystallization region.

2. A method of crystallizing amorphous silicon using a mask having a transmitting portion including first and second stripes parallel with each other, wherein end lines of the first and second stripes are not collinear and having a blocking portion enclosing the first and second stripes, the method comprising:
- placing the mask over a substrate having an amorphous silicon layer;
- applying a first laser beam to a first area of the amorphous silicon layer through the mask, thereby forming a first crystallization region;
- moving the substrate in a first direction, thereby disposing the blocking portion of the mask over the first crystallization region;
- applying a second laser beam to the first area of the amorphous silicon layer through the mask, thereby forming a second crystallization region; and
- repeatedly moving the substrate in a second direction by a transmitting portion length and applying a laser beam to the amorphous silicon layer after applying the first laser beam.

3. The method according to claim 2, further comprising, repeatedly moving the substrate in a second direction by the transmitting portion length and applying a laser beam to the amorphous silicon layer after applying the second laser beam.

4. The method according to claim 1, wherein a width of the transmitting portion is wider than a width of blocking portion.

5. The method according to claim 1, wherein the first crystallization region overlaps the second crystallization region.

6. The method according to claim 1, wherein the first and second stripes have the same length.

7. The method according to claim 1, wherein the first and second laser beams have an intensity sufficient to completely melt the amorphous silicon layer.

* * * * *